US010559540B2

(12) United States Patent
Lee et al.

(10) Patent No.: US 10,559,540 B2
(45) Date of Patent: Feb. 11, 2020

(54) FAN-OUT SEMICONDUCTOR PACKAGE

(71) Applicant: SAMSUNG ELECTRONICS CO., LTD., Suwon-si (KR)

(72) Inventors: Chang Bo Lee, Suwon-Si (KR); Joon Seok Oh, Suwon-Si (KR); Hyun Chul Jung, Suwon-Si (KR); Jeong Ho Yeo, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/004,007

(22) Filed: Jun. 8, 2018

(65) Prior Publication Data

US 2019/0164908 A1    May 30, 2019

(30) Foreign Application Priority Data

Nov. 30, 2017    (KR) .......................... 10-2017-0163039

(51) Int. Cl.
*H01L 23/538*    (2006.01)
*H01L 23/31*    (2006.01)
*H01L 23/00*    (2006.01)

(52) U.S. Cl.
CPC ........ *H01L 23/562* (2013.01); *H01L 23/3114* (2013.01); *H01L 23/5383* (2013.01);
(Continued)

(58) Field of Classification Search
CPC ............... H01L 23/562; H01L 23/3114; H01L 23/5383; H01L 23/5389; H01L 24/20; H01L 2224/214; H01L 2924/3511; H01L 23/5386; H01L 23/481; H01L 2224/821; H01L 2224/96; H01L 2224/73204;
(Continued)

(56) References Cited

U.S. PATENT DOCUMENTS 9,318,429 B2 *    4/2016  Hu ................... H01L 23/49861
2014/0353823 A1 *   12/2014  Park .................... H01L 23/3128
257/737
(Continued)

FOREIGN PATENT DOCUMENTS

KR        10-0627563 B1      9/2006
KR     10-2017-0074080 A     6/2017
(Continued)

OTHER PUBLICATIONS

Office Action issued in corresponding Korean Patent Application No. 10-2017-0163039, dated Sep. 17, 2018.
(Continued)

*Primary Examiner* — Caridad Everhart
(74) *Attorney, Agent, or Firm* — Sughrue Mion, PLLC

(57) ABSTRACT

A fan-out semiconductor package includes a first connection member having a through-hole first and second semiconductor chips disposed in the through-hole, an encapsulant encapsulating the first and second semiconductor chips, a second connection member disposed on at least one side of the first and second semiconductor chips and including a redistribution layer electrically connected to the first and second semiconductor chips, and an insulating via in which at least a portion of the first connection member is removed in a thickness direction and is filled with an insulating material.

20 Claims, 12 Drawing Sheets

(52) U.S. Cl.
CPC ...... *H01L 23/5386* (2013.01); *H01L 23/5389* (2013.01); *H01L 24/20* (2013.01); *H01L 2224/214* (2013.01); *H01L 2924/3511* (2013.01)

(58) Field of Classification Search
CPC . H01L 2224/02377; H01L 2224/02379; H01L 2924/181; H01L 2924/18162; H01L 23/3128; H01L 23/49383; H05K 1/185
See application file for complete search history.

(56) References Cited

U.S. PATENT DOCUMENTS

| | | |
|---|---|---|
| 2016/0365334 A1 | 12/2016 | Shih et al. |
| 2017/0178992 A1 | 6/2017 | Jeong et al. |
| 2017/0294469 A1 | 10/2017 | Lee et al. |
| 2017/0309571 A1 | 10/2017 | Yi et al. |
| 2018/0068978 A1* | 3/2018 | Jeng ................. H01L 21/56 |
| 2018/0138132 A1* | 5/2018 | Nishizawa ......... H01L 23/02 |
| 2018/0337122 A1* | 11/2018 | Liao .................. H01L 23/3128 |

FOREIGN PATENT DOCUMENTS

| | | |
|---|---|---|
| KR | 10-2017-0121671 A | 11/2017 |
| TW | 201643996 A | 12/2016 |
| TW | 201737428 A | 10/2017 |
| TW | 201737475 A | 10/2017 |

OTHER PUBLICATIONS

Office Action issued in Taiwanese Patent Application No. 107119309 dated Mar. 6, 2019, with English translation.

* cited by examiner

FAN-OUT SEMICONDUCTOR PACKAGE

CROSS-REFERENCE TO RELATED APPLICATION(S)

This application claims the benefit of priority to Korean Patent Application No. 10-2017-0163039 filed on Nov. 30, 2017, in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A significant recent trend in the development of technology related to semiconductor chips has been to reduce the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of semiconductor package technology suggested to satisfy the technical demand as described above is a fan-out semiconductor package. Such a fan-out package has a compact size and may allow a plurality of pins to be implemented by redistributing connection terminals outwardly of a region in which a semiconductor chip is disposed.

In such a semiconductor package, since thermal expansion characteristics of a semiconductor chip, a wiring layer, an insulating layer, and the like included in the semiconductor chip are different from each other, a warpage may occur and thus, attempts to reduce warpage have been made.

SUMMARY

An aspect of the present disclosure may provide a fan-out semiconductor package in which structural stability may be improved by reducing warpage.

According to an aspect of the present disclosure, a fan-out semiconductor package may include a first connection member having a through-hole; first and second semiconductor chips disposed in the through-hole; an encapsulant encapsulating the first and second semiconductor chips; a second connection member disposed on at least one side of the first and second semiconductor chips and including a redistribution layer electrically connected to the first and second semiconductor chips; and an insulating via in which at least a portion of the first connection member is removed in a thickness direction and is filled with an insulating material.

The first semiconductor chip may have a size greater than that of the second semiconductor chip.

The fan-out semiconductor chip may be a left and right asymmetric structure with respect to a center line perpendicular to a first direction when a direction in which the first and second semiconductor chips are arranged is the first direction.

In the first connection member, a width of an outer region of the first semiconductor chip may be greater than a width of an outer region of the second semiconductor chip with respect to a width of the first direction.

An amount of encapsulant in a half region in which the second semiconductor chip is disposed may be greater than an amount of encapsulant in a half region in which the first semiconductor chip is disposed with respect to the center line perpendicular to the first direction.

The insulating via may be only disposed in an outer region of the first semiconductor chip.

The first connection member may include a plurality of conductive vias penetrating through the first connection member, and the plurality of conductive vias may be arranged along an outer portion of the first connection member.

The insulating via may be disposed between the plurality of conductive vias.

The insulating material forming the insulating via may have the same coefficient of thermal expansion as that of the encapsulant.

The insulating material forming the insulating via may be a material forming the encapsulant.

A plurality of insulating vias having a cylindrical shape may be formed and be aligned and disposed in one direction The insulating via may have a shape penetrating through the first connection member.

The insulating via may have a trench shape which does not penetrate through the first connection member.

The insulating via may be in contact with a wiring layer included in the first connection member.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Electronic Device

Figure 1:
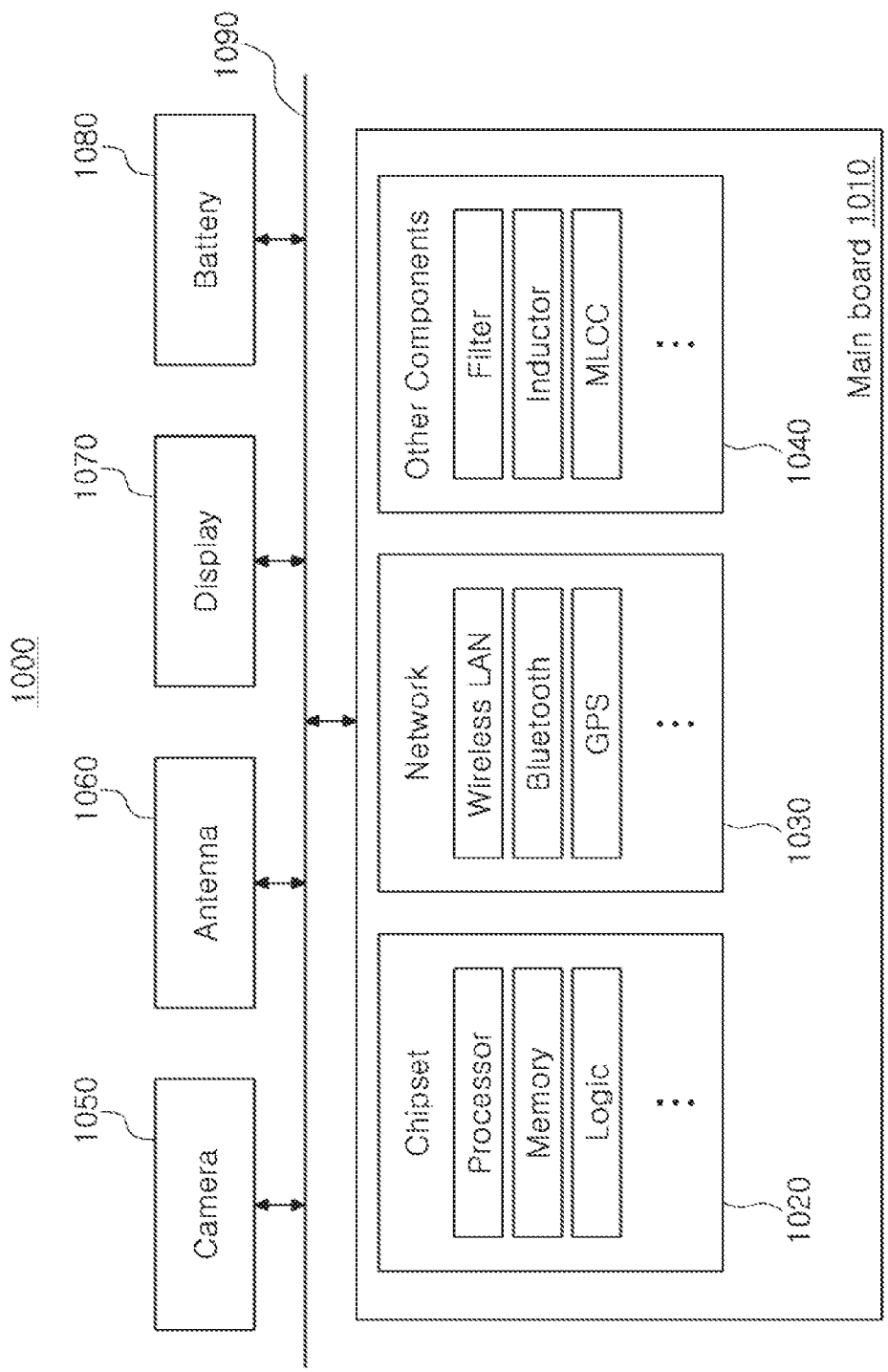
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive, or the like. However, the electronic device 1000 is not limited thereto, but may be any other electronic device processing data.

Figure 2:
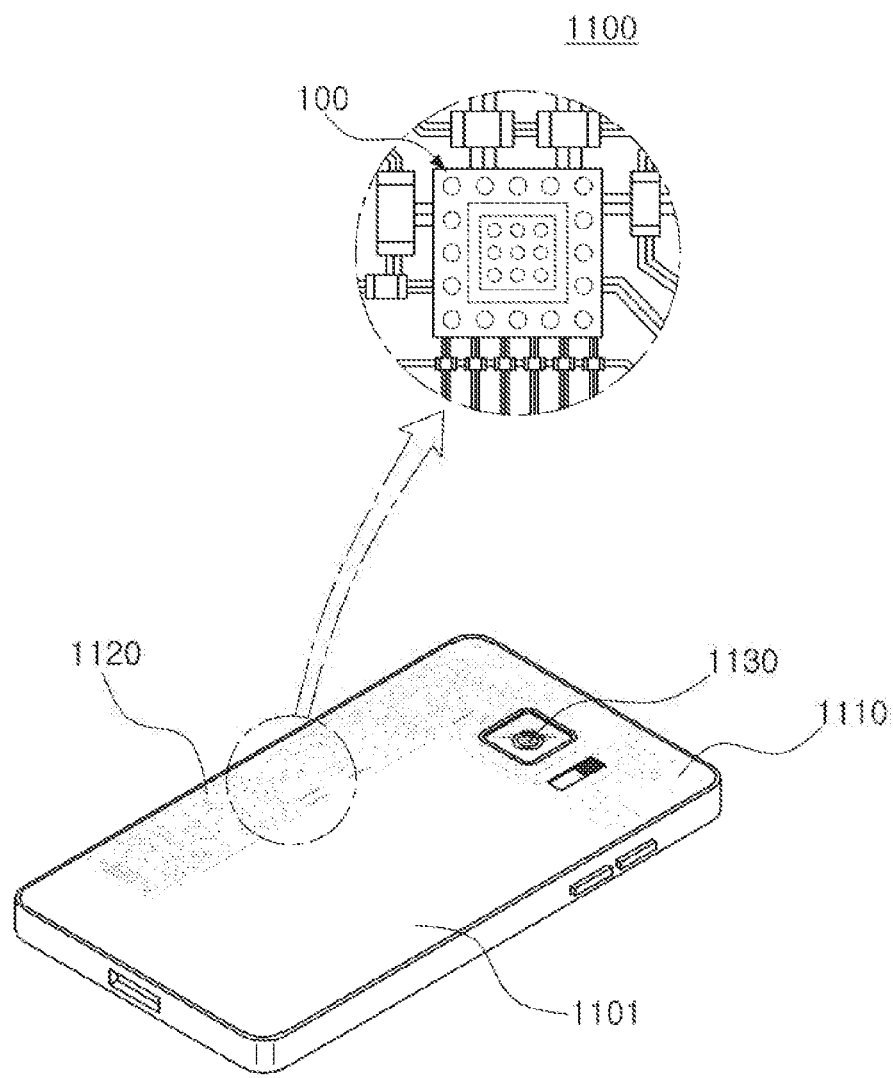
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various components 1120 may be physically or electrically connected to the main board 1110. In addition, other components that may or may not be physically or electrically connected to the main board 1010, such as a camera 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

(Fan-In Semiconductor Package)

Figure 3B:
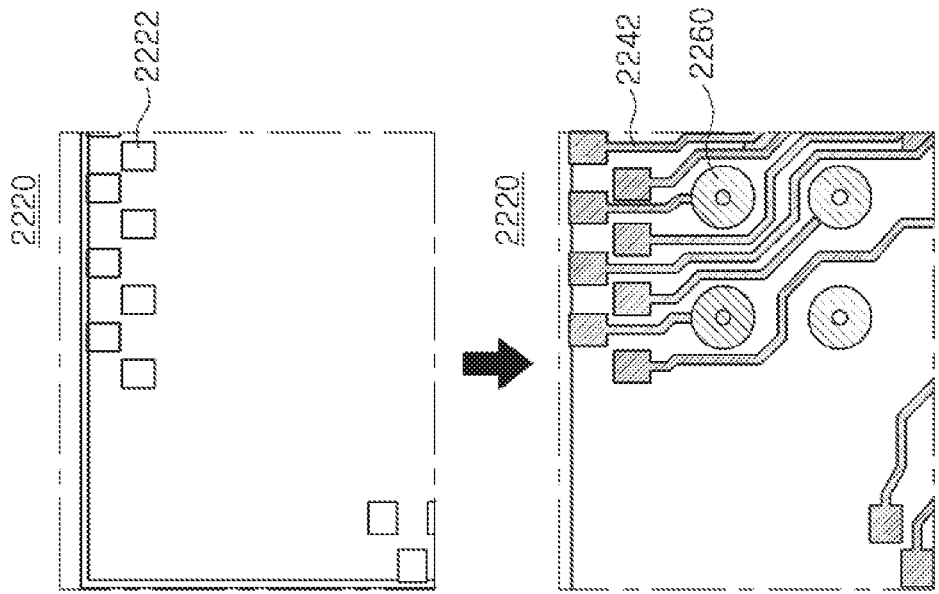
FIGS. 3A and 3B are schematic cross-sectional views illustrating states of a fan-in semiconductor package before and after being packaged.
Figure 3A:
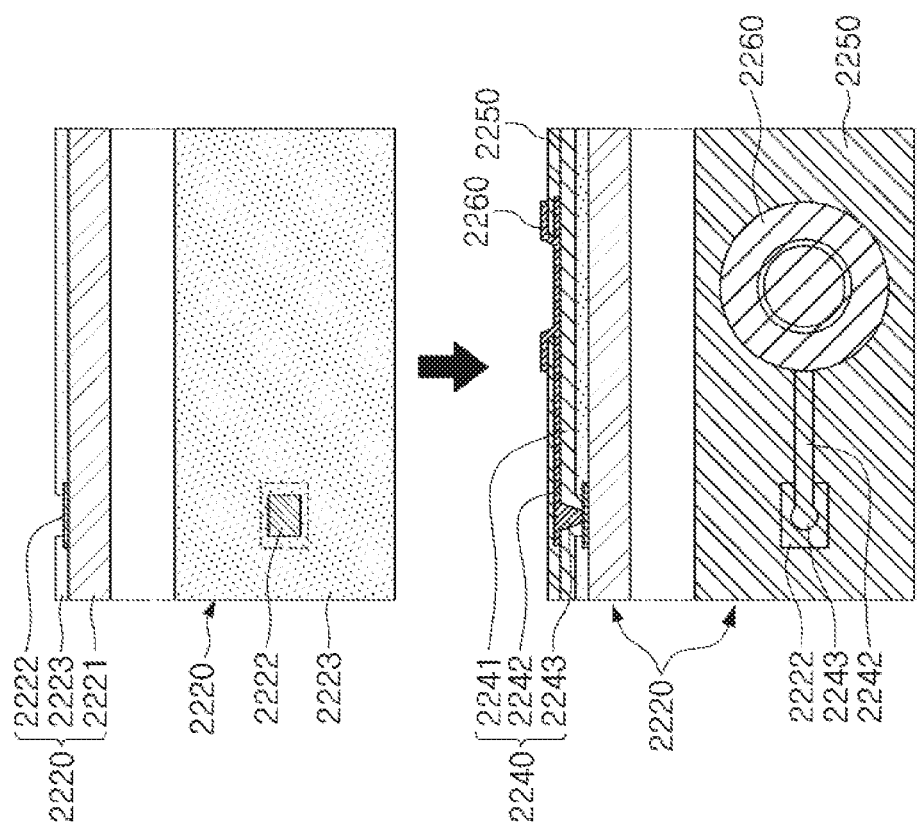

FIGS. 3A and 3B are schematic cross-sectional views illustrating states of a fan-in semiconductor package before and after being packaged.

Figure 4:
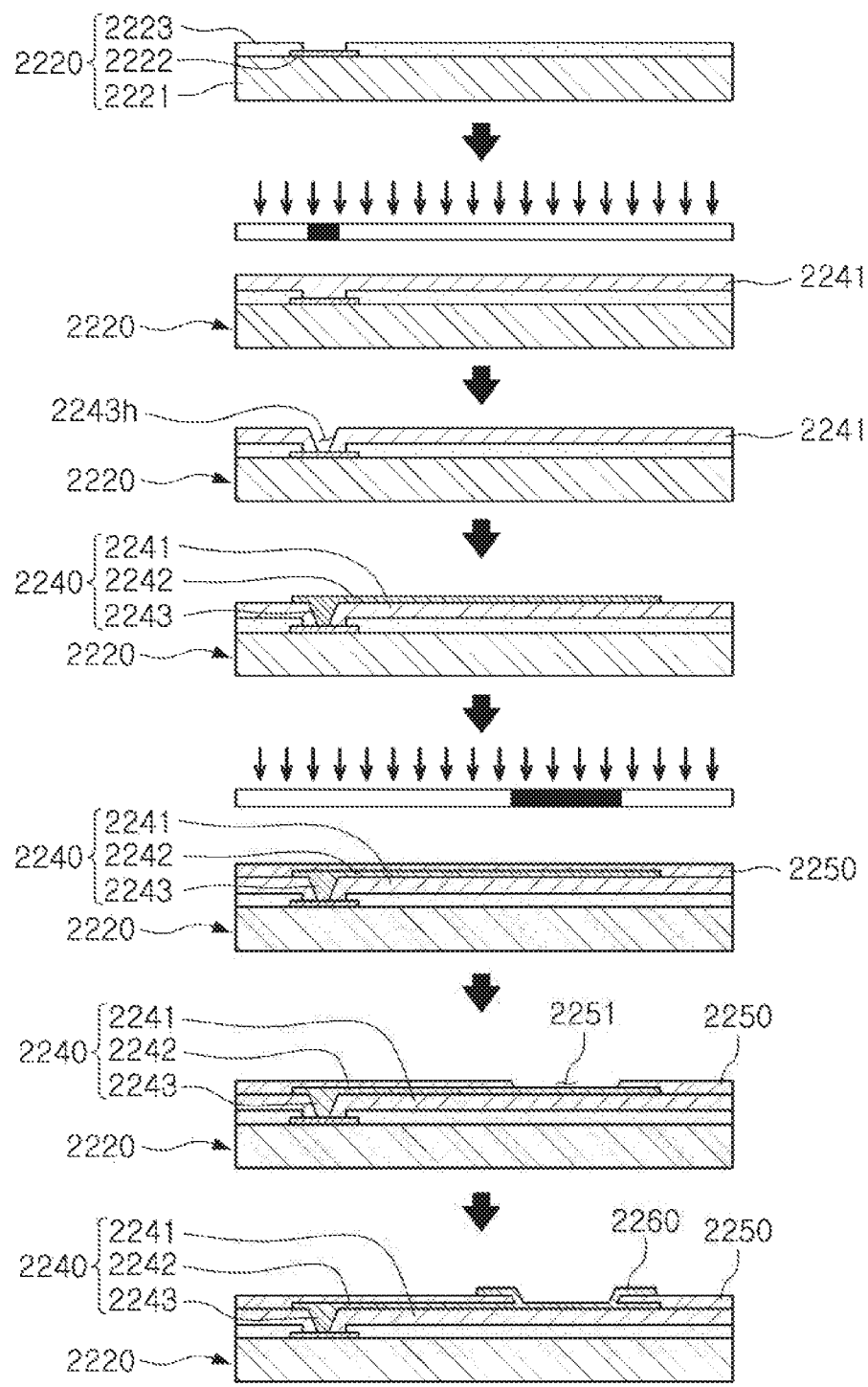
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as photo imagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
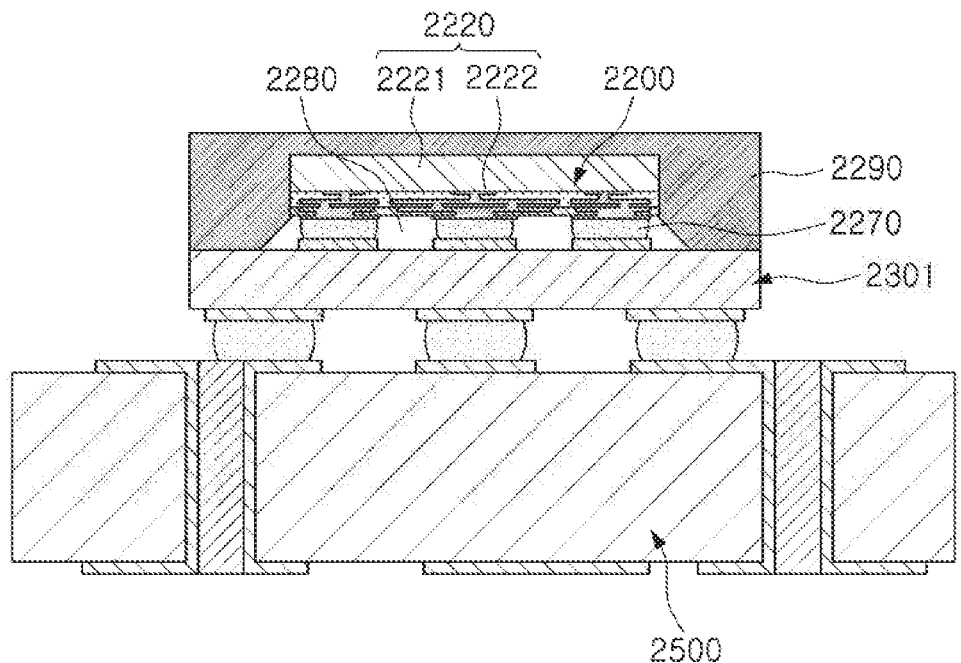
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
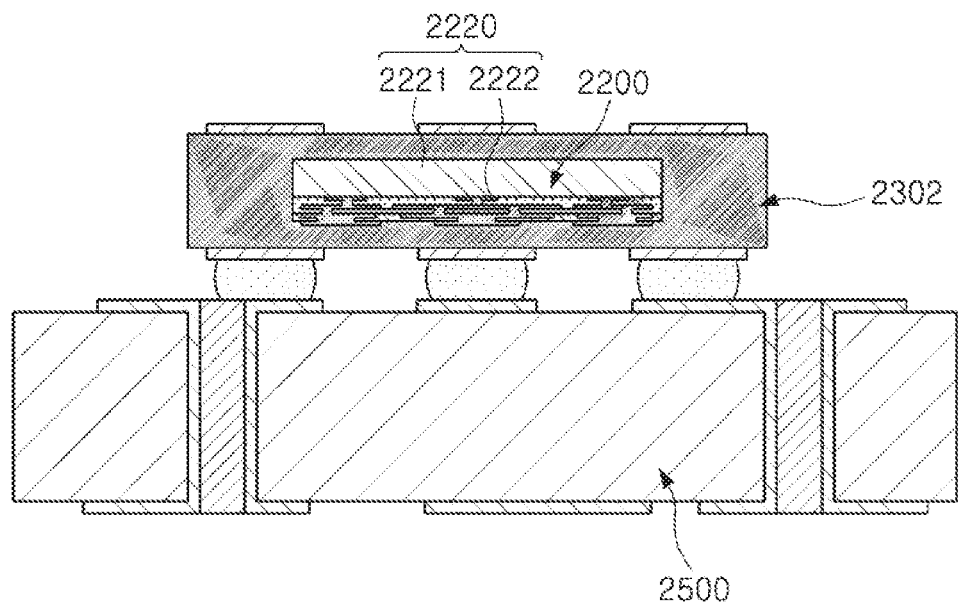
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be finally mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

(Fan-Out Semiconductor Package)

Figure 7:
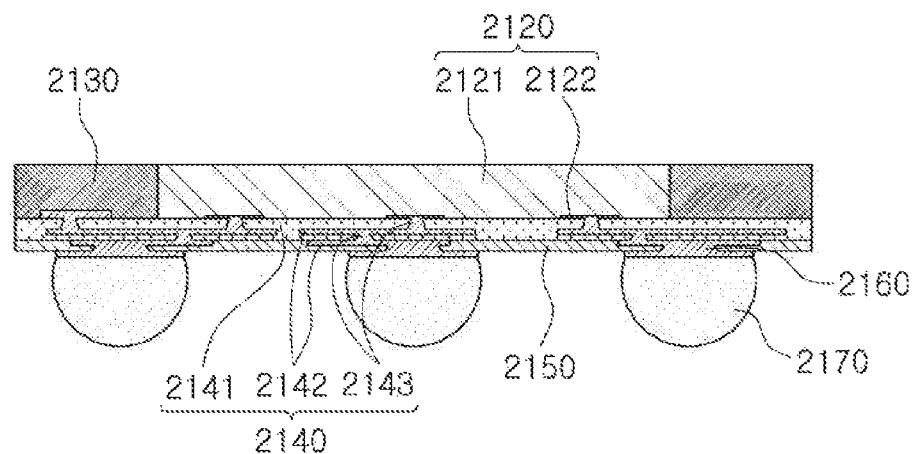
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2202 may be further formed on the connection member 2140, and an underbump metal layer 2106 may be further formed in openings of the passivation layer 2202. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2241, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
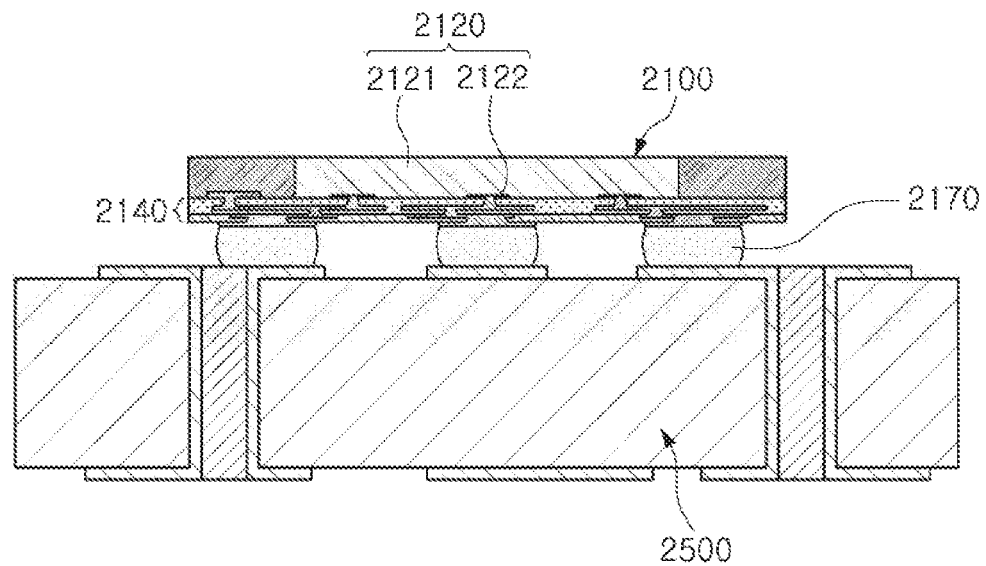
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package according to exemplary embodiment in the present disclosure will hereinafter be described with reference to the drawings.

Figure 9:
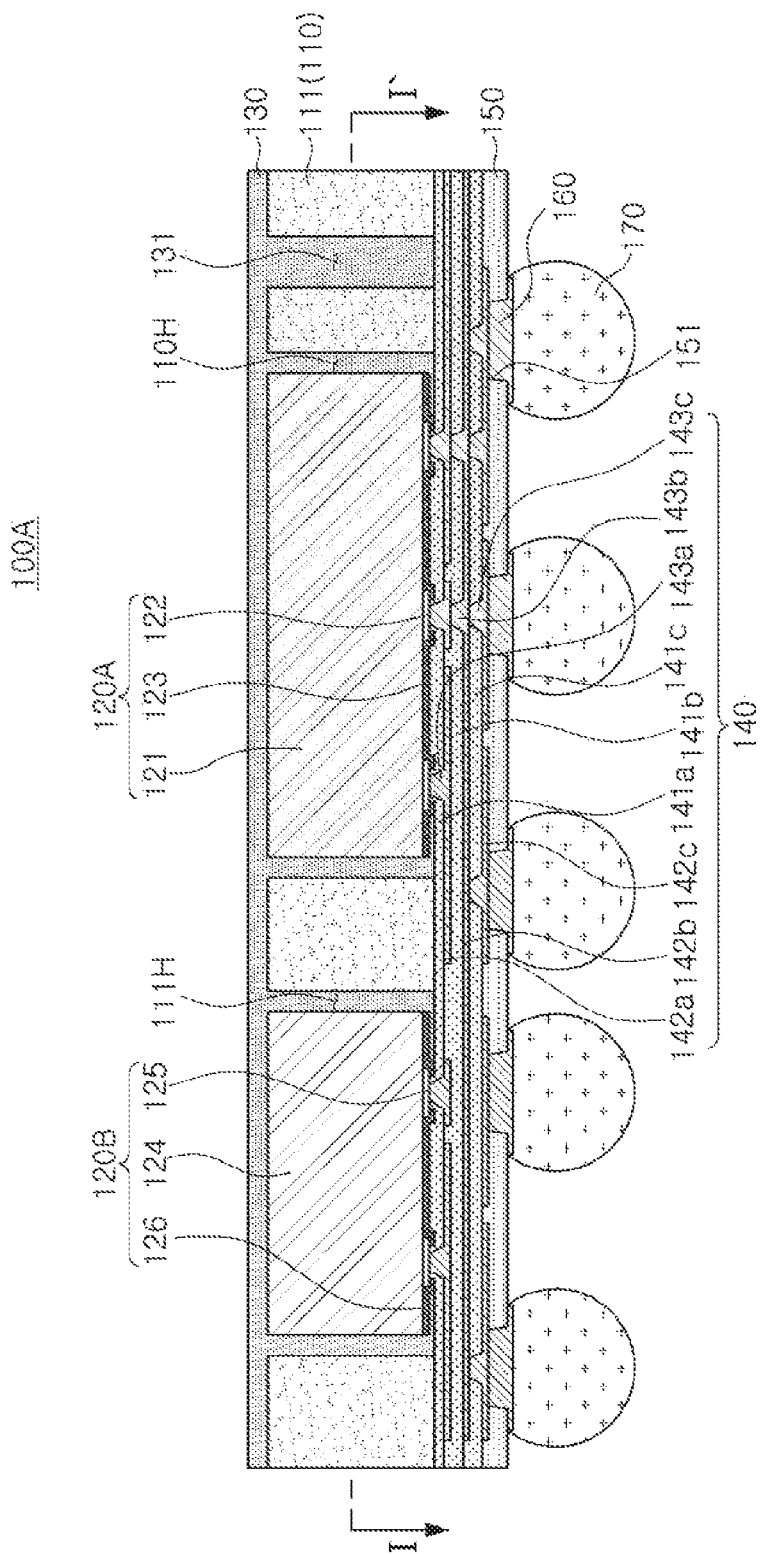
FIG. 9 is a schematic cross-sectional view illustrating an example of a fan-out semiconductor package.
Figure 10:
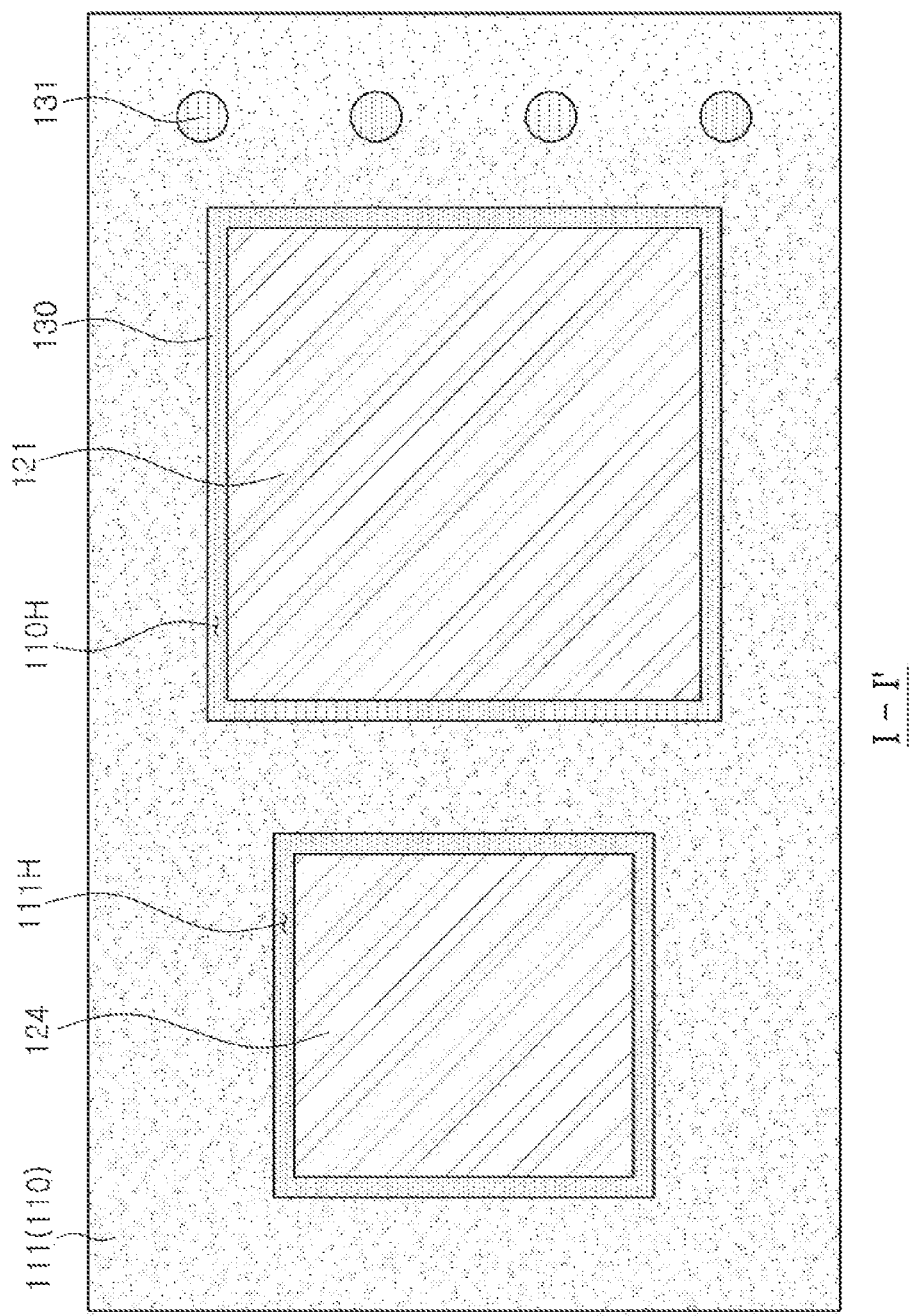
FIG. 10 is a schematic plan view taken along line I-I' of the fan-out semiconductor package of FIG. 9.

FIG. 9 is a schematic cross-sectional view illustrating an example of a fan-out semiconductor package. FIG. 10 is a schematic plan view taken along line I-I' of the fan-out semiconductor package of FIG. 9.

Referring to the drawings, a fan-out semiconductor package 100A according to an exemplary embodiment in the present disclosure may include a first connection member 110 having through-holes 110H and 111H, first and second semiconductor chips 120A and 120B, an encapsulant 130, and a second connection member 140. An insulating via 131 in which a hole penetrating through the first connection member 110 in a thickness direction thereof is filled with an insulating material may be formed. In addition to the components described above, the fan-out semiconductor package 100A may include a passivation layer 150, an under-bump metal layer 160, an electrical connection structure 170, and the like.

The first connection member 110 may further improve rigidity of the fan-out sensor package 100A depending on certain materials, and serve to secure uniformity of a thickness of the encapsulant 130. When through-wirings, or the like, are formed in the first connection member 110 as in an exemplary embodiment to be described below, the fan-out semiconductor package 100 may also be utilized as a package-on-package (POP) type package. According to the present exemplary embodiment, the first connection member 110 may have a plurality of through-holes 110H and 111H, which may be referred to as a first through-hole 110H and a second through-hole 111H, respectively. The first semiconductor chip 120A may be disposed in the first through-hole 110H and the second semiconductor chip 120B may be disposed in the second through-hole 111H. In this case, side surfaces of the semiconductor chips 120A and 120B may be surrounded by the first connection member 110. However, such a form is only an example and may be variously modified to have other forms, and the first connection member 110 may perform another function depending on such a form. The first connection member 110 may be omitted, if necessary, but it may be more advantageous in securing the board level reliability when the fan-out semiconductor package 100 includes the first connection member 110. In addition, the present exemplary embodiment illustrates a case in which the first and second semiconductor chips 120A and 120B are disposed indifferent through-holes 110H and 111H, but the first and second semiconductor chips 120A and 120B may also be disposed in one through-hole.

The first connection member 110 may include an insulating layer 111. An insulating material may be used as the material of the insulating layer 111. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass fiber, a glass cloth or a glass fabric), for example, prepreg, Ajinomoto Build-up Film (ABF), FR-4, Bismaleimide Triazine (BT), or the like. Such a first connection member 110 may serve as a support member.

The first and second semiconductor chips 120A and 120B may be an integrated circuit (IC) provided in an amount of several hundreds to several millions of elements or more integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the above-mentioned elements may also be combined with each other and be disposed.

The first and second semiconductor chips 120A and 120B may be formed on the basis of an active wafer. In this case, a base material of bodies 121 and 124 may be silicon (Si), germanium (Ge), gallium arsenide (GaAs), or the like. Various circuits may be formed on the bodies 121 and 124. The connection pads 122 and 125 may electrically connect the first and second semiconductor chips 120A and 120B to other components, and a conductive material such as aluminum (Al), or the like, may be used as a material of each of the connection pads 122 and 125. Passivation layers 123 and 126 exposing the connection pads 122 and 125 may be formed on the bodies 121 and 124, and may be an oxide film, a nitride film, or the like, or a double layer of an oxide layer and a nitride layer. A lower surface of each of the connection pads 122 and 125 may have a step with respect to a lower surface of the encapsulant 130 through the respective passivation layers 123 and 126. Resultantly, a phenomenon in which the encapsulant 130 bleeds into the lower surface of each of the connection pads 122 and 125 may be prevented to some extent. An insulating layer (not illustrated), and the like, may also be further disposed in other required positions. The first and second semiconductor chips 120A and 120B may be a bare die. Alternatively, a redistribution layer (not illustrated) may be further formed on the active surfaces of the first and semiconductor chips 120A and 120B, if necessary, and bumps (not illustrated), or the like, may be connected to the connection pads 122 and 125. The first and second semiconductor chips 120A and 120B may be the same kind of chips or may be different kinds of chips. Although the present exemplary embodiment describes an example in which two semiconductor chips 120A and 120B are used, three or more semiconductor chips may also be used.

According to the present exemplary embodiment, as illustrated, the first semiconductor chip 120A may have a size greater than that of the second semiconductor chip 120B. In a case in which the semiconductor chips 120A and 120B having different sizes as described above are disposed in one fan-out semiconductor package 100A, the fan-out semiconductor package 100A becomes an asymmetric structure and a warpage problem may be further intensified. In detail, when a direction in which the first and second semiconductor chips 120A and 120B having different sizes are arranged is a first direction (I-I' direction), the fan-out semiconductor package 100A according to the present exemplary embodiment may have an asymmetric structure with respect to a center line perpendicular to the first direction.

As illustrated in FIG. 10, in such an asymmetric structure, in the first connection member 110, a width of an outer region (on the right in FIG. 10) of the first semiconductor chip 120A may be greater than a width of an outer region (on the left in FIG. 10) of the second semiconductor chip 120B with respect to a width of the first direction. Accordingly, the respective component of the fan-out semiconductor package 100A may have a right and left asymmetric structure. For example, an amount of encapsulant 130 may vary at the left and right in the first direction. The amount of encapsulant 130 may be greater in a half region (left) in which the second semiconductor chip 120B is disposed than in a half region (right) in which the first semiconductor chip 120A is disposed with respect to the center line perpendicular to the first direction. Since the amount of encapsulant 130 in the left region is greater than that in the right region, stress may concentrate on the left of the fan-out semiconductor package 100A when the encapsulant 130 is cured and shrinks, which may cause warpage. Such a stress concentration problem may further increased as the number or kind of semiconductor chips is increased.

According to the present exemplary embodiment, in order to solve such a problem, an insulating via 131 in which at least a portion of the first connection member 110 is removed in a thickness direction and is filled with an insulating material may be used. The insulating via 131 may be only disposed in a region in which the amount of encapsulant 130 is relatively small, that is, an outer region of the first semiconductor chip 120A. The insulating material forming the insulating via 131 may have the same or similar coefficient of thermal expansion as the encapsulant 130, thereby alleviating a difference in thermal expansion characteristics of the fan-out semiconductor package 100A across the first direction. In this case, the insulating via 131 may also be formed of the material forming the encapsulant 130, and may be formed by filling the material forming the encapsulant 130 in the hole of the first connection member 110 in a process of forming the encapsulant 130.

As illustrated in FIGS. 9 and 10, the insulating via 131 may have a shape penetrating through the first connection member 110. In addition, a plurality of insulating vias 131 of a cylindrical shape may be aligned and disposed in one direction, and thermal expansion characteristics of the corresponding region may be effectively adjusted by such a layout way.

The encapsulant 130 may protect the first connection member 110, the semiconductor chips 120A and 120B, and the like. An encapsulation form of the encapsulant 130 is not particularly limited, but may be a form in which the encapsulant 130 surrounds at least portions of the first connection member 110, the semiconductor chips 120A and 120B, and the like. For example, the encapsulant 130 may cover the first connection member 110 and the inactive surfaces of the first and second semiconductor chips 120A and 120B, and fill spaces between walls of the through-hole 110H and the side surfaces of the first and second semiconductor chips 120A and 120B. In addition, the encapsulant 130 may also fill at least portions of spaces between the passivation layers 123 and 126 of the first and second semiconductor chips 120A and 120B and the second connection member 140. The encapsulant 130 may fill the through-holes 110H and 111H to thus serve as an adhesive and reduce buckling of the semiconductor chips 120A and 120B depending on certain materials.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternatively, a PID resin may also be used as the insulating material.

The second connection member 140 may redistribute the connection pads 122 and 125 of the first and second semiconductor chips 120A and 120B. Several tens to several hundreds of connection pads 122 and 125 of the first and second semiconductor chips 120A and 120B having various functions may be redistributed by the second connection member 140, and may be physically or electrically externally connected through the electrical connection structures 170 depending on the functions. To this end, the second connection member 140 may include redistribution layers 142a, 142b, and 142c. As an example, the second connection member 140 may include a first insulating layer 141a disposed on the first connection member 110 and the active surfaces of the first and second semiconductor chips 120A and 120B, a first redistribution layer 142a disposed on the first insulating layer 141a, a first via 143a connecting the first insulating layer 141a and the connection pads 122 of the first and second semiconductor chip 120A and 120B to each other, a second insulating layer 141*b* disposed on the first insulating layer 141*a*, a second redistribution layer 142*b* disposed on the second insulating layer 141*b*, a second via 143*b* penetrating through the second insulating layer 141*b* and connecting the first and second redistribution layers 142*a* and 142*b* to each other, a third insulating layer 141*c* disposed on the second insulating layer 141*b*, a third redistribution layer 142*c* disposed on the third insulating layer 141*c*, and a third via 143*c* penetrating through the third insulating layer 141*c* and connecting the second and third redistribution layers 142*b* and 142*c* to each other. The first to third redistribution layers 142*a*, 142*b*, and 142*c* may be electrically connected to connection pads 122 and 125 of the first and second semiconductor chip 120A and 120B. However, the number of redistribution layers 142*a*, 142*b*, and 142*c*, insulating layers 141*a*, 142*b*, and 141*c*, and vias 143*a*, 143*b*, and 143*c* may be changed, if necessary.

An insulating material included in the insulating layers 141*a*, 141*b*, and 141*c* may also be, for example, a photosensitive insulating material. When the insulating layers 141*a*, 141*b*, and 141*c* has photosensitive properties, the insulating layers 141*a*, 141*b*, and 141*c* may be formed to have a smaller thickness, and fine pitches of the via layers 143*a*, 143*b*, and 143*c* may be achieved more easily. The insulating layers 141*a*, 141*b*, and 141*c* may be photosensitive insulating layers including an insulating resin and an inorganic filler. When the insulating layers 141*a*, 141*b*, and 141*c* are multiple layers, the materials of the insulating layers 141*a*, 141*b*, and 141*c* may be the same as each other, and may also be different from each other, if necessary. When the insulating layers 141*a*, 141*b*, and 141*c* are the multiple layers, the insulating layers 141*a*, 141*b*, and 141*c* may be integrated with each other depending on a process, such that a boundary therebetween may also not be apparent. A larger number of insulating layers than those illustrated in the drawing may be formed.

The redistribution layers 142*a*, 142*b*, and 142*c* may serve to substantially redistribute the connection pads 122. A material of each of the redistribution layers 142*a*, 142*b*, and 142*c* may be a conductive material such as copper (Cu), aluminum (Al), silver (Ag), tin (Sn), gold (Au), nickel (Ni), lead (Pb), titanium (Ti), or alloys thereof. The redistribution layers 142*a*, 142*b*, and 142*c* may perform various functions depending on designs of their corresponding layers. For example, the redistribution layer 142 may include ground patterns, signal patterns, and the like. Here, the signal patterns may include various signals except for the ground patterns, the power patterns, and the like, such as data signals, and the like. In addition, the redistribution layer 142 may include via pad patterns, connection terminal pad patterns, and the like.

The vias 143*a*, 143*b*, and 143*c* may electrically connect the redistribution layers 142*a*, 142*b*, and 142*c*, the connection pads 122 and 125, or the like, formed on different layers to each other, resulting in an electrical path in the fan-out semiconductor package 100A. A material of each of the vias 143*a*, 143*b*, and 143*c* may be a conductive material such as copper (Cu), aluminum (Al), silver (Ag), tin (Sn), gold (Au), nickel (Ni), lead (Pb), titanium (Ti), or alloys thereof. Each of the vias 143*a*, 143*b*, and 143*c* may be completely filled with the conductive material, or the conductive material may also be formed along a wall of each of the vias. In addition, each of the vias 143 may have all of the shapes known in the related art, such as a tapered shape, a cylindrical shape, and the like.

A passivation layer 150 may protect the second connection member 140 from external physical or chemical damage, or the like. The passivation layer 150 may have openings 151 exposing at least portions of the redistribution layers 142*a*, 142*b*, and 142*c* of the second connection member 140. The number of openings 151 formed in the passivation layer 150 may be several tens to several thousands. A material of the passivation layer 150 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternatively, a solder resist may also be used.

The underbump metal layer 160 may improve connection reliability of the electrical connection structures 170 to improve board level reliability of the fan-out semiconductor package 100A. The underbump metal layer 160 may be connected to the redistribution layers 142*a*, 142*b*, and 142*c* of the second connection member 140 exposed through the openings 151 of the passivation layer 150. The underbump metal layer 160 may be formed in the openings 151 of the passivation layer 150 by the known metallization method using the known conductive metal such as a metal, but is not limited thereto.

The electrical connection structures 170 may physically or electrically externally connect the fan-out semiconductor package 100A. For example, the fan-out semiconductor package 100A may be mounted on the main board of the electronic device through the electrical connection structures 170. Each of the electrical connection structures 170 may be formed of a conductive material, for example, a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122 and 125, or may be provided in an amount of several tens to several thousands or more or several tens to several thousands or less. When the electrical connection structures 170 are solder balls, the electrical connection structures 170 may cover side surfaces of the underbump metal layer 160 extending onto one surface of the passivation layer 150, and connection reliability may be more excellent.

At least one of the electrical connection structures 170 may be disposed in a fan-out region. The fan-out region is a region except for a region in which the first and second semiconductor chips 120A and 120B are disposed. The fan-out package may have reliability greater than that of a fan-in package, may implement a plurality of I/O terminals, and may easily perform 3D interconnection In addition, as compared to a ball grid array (BGA) package, a land grid array (LGA) package, or the like, the fan-out package may be manufactured to have a small thickness, and may have price competitiveness.

Meanwhile, although not illustrated in the drawings, a metal thin film may be formed on the walls of the through-holes 110H and 111H, if necessary, in order to dissipate heat or block electromagnetic waves. In addition, a plurality of semiconductor chips 120A and 120B performing functions that are the same as or different from each other may be disposed in the through-holes 110H and 111H, if necessary. In addition, a separate passive component such as an inductor, a capacitor, or the like, may be disposed in the through-hole 110H, if necessary. In addition, a passive component, for example, a surface mounted technology (SMT) component including an inductor, a capacitor, or the like, may be disposed on a surface of the passivation layer 150, if necessary.

A fan-out semiconductor package according to another exemplary embodiment in the present disclosure will be described with reference to FIGS. 11 through 14.

Figure 11:
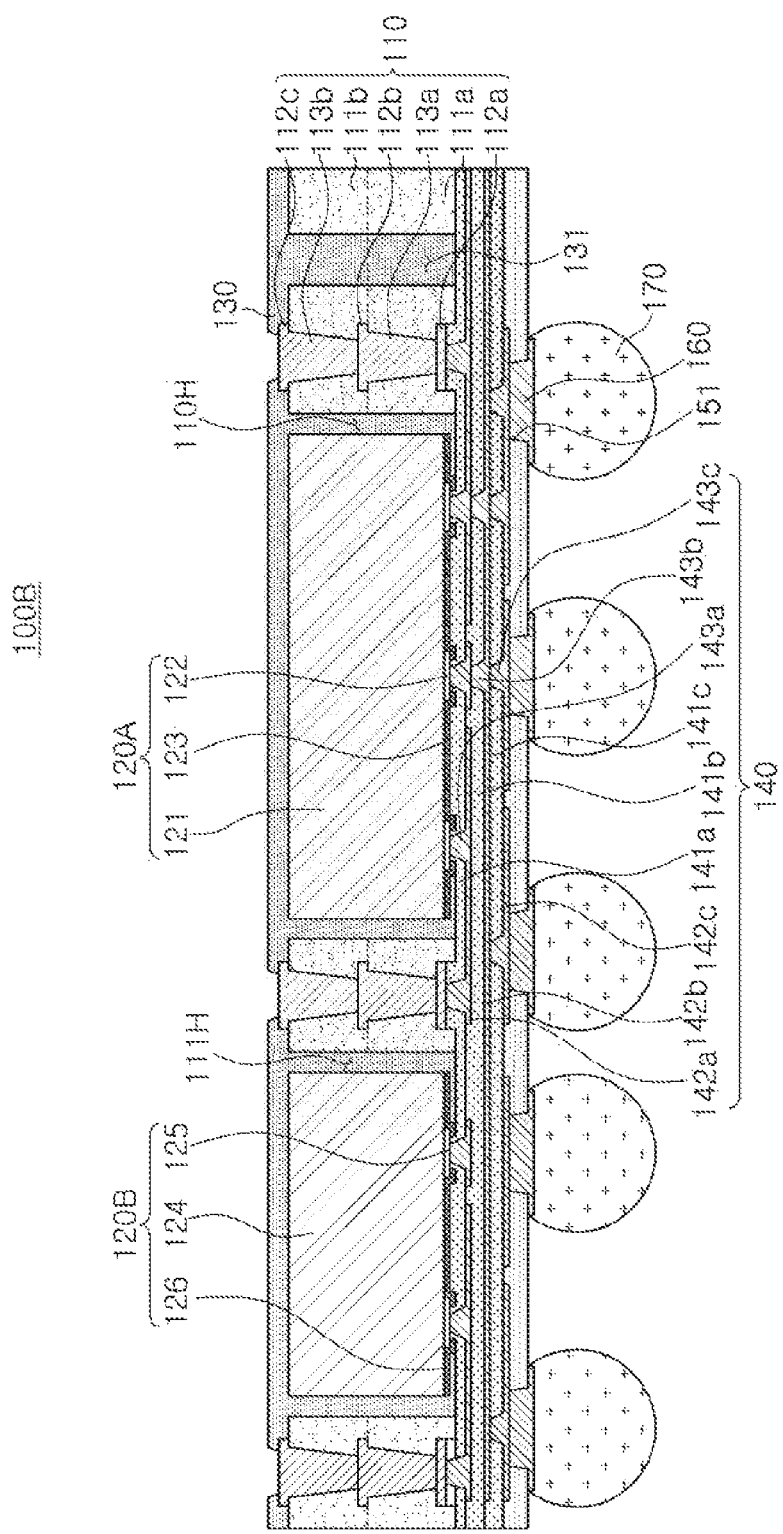
FIGS. 11 through 14 schematically illustrate a fan-out semiconductor package according to each of modified examples.
Figure 12:
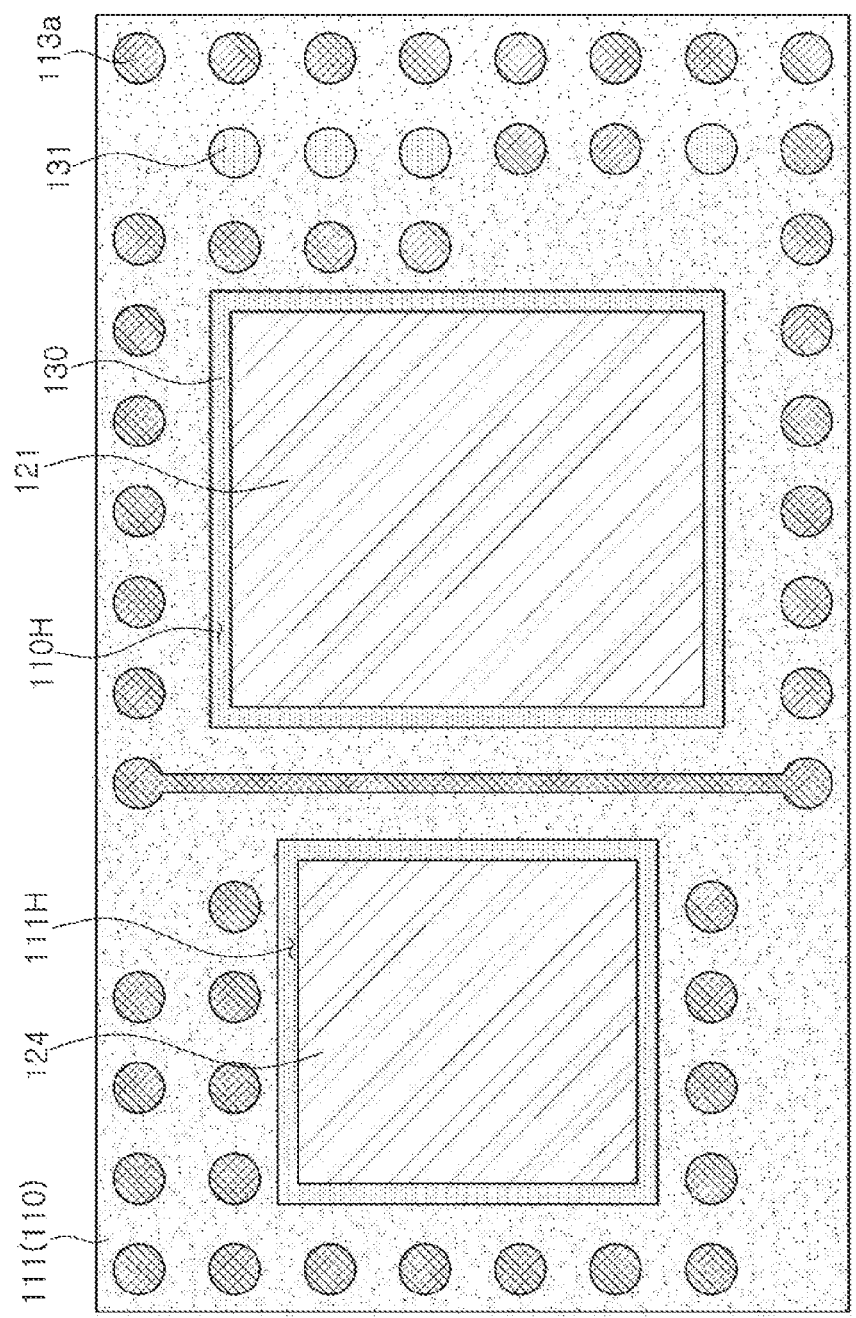

First, in a fan-out semiconductor package 100B according to an exemplary embodiment of FIGS. 11 and 12, a plurality of conductive vias serving to perform interlayer electricity conduction are installed in the first connection member 110. In detail, the first connection member 110 may include a first insulating layer 111a in contact with the second connection member 140, a first wiring layer 112a in contact with the second connection member 140 and embedded in the first insulating layer 111a, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, and a third wiring layer 112c disposed on the second insulating layer 111b. The first to third wiring layers 112a, 112b, and 112c may be electrically connected to connection pads 122 and 125. The first and second wiring layers 112a and 112b and the second and third wiring layers 112b and 112c may be electrically connected to each other through first and second vias 113a and 113b penetrating through the first and second insulating layers 111a and 111b, respectively.

When the first wiring layer 112a is embedded in the first insulating layer 111a, a step generated due to a thickness of the first wiring layer 112a may be significantly reduced, and an insulating distance of the second connection member 140 may thus become constant. That is, a difference between a distance from a first wiring layer 142a of the second connection member 140 to a lower surface of the first insulating layer 111a and a distance from the first redistribution layer 142a of the second connection member 140 to the connection pads 122 and 125 of the semiconductor chips 120A and 120B may be smaller than a thickness of the first wiring layer 112a. Therefore, a high density wiring design of the second connection member 140 may be easy.

As illustrated in FIG. 11, the lower surface of the first wiring layer 112a of the first connection member 110 may be disposed on a level above lower surfaces of the connection pads 122 and 125 of the semiconductor chips 120A and 120B. In addition, a distance between the first redistribution layer 142a of the second connection member 140 and the first wiring layer 112a of the first connection member 110 may be greater than that between the first redistribution layer 142a of the second connection member 140 and the connection pads 122 and 125 of the semiconductor chips 120A and 120B. The reason is that the first wiring layer 112a may be recessed into the insulating layer 111. As described above, when the first wiring layer 112a is recessed into the first insulating layer 111a, such that the lower surface of the first insulating layer 111a and the lower surface of the first wiring layer 112a have a step therebetween, a phenomenon in which a material of the encapsulant 130 bleeds to pollute the first wiring layer 112a may be prevented. The second wiring layer 112b of the first connection member 110 may be disposed on a level between an active surface and an inactive surface of the semiconductor chips 120A and 120B. The first connection member 110 may be formed at a thickness corresponding to that of the semiconductor chips 120A and 120B. Therefore, the second wiring layer 112b formed in the first connection member 110 may be disposed on the level between the active surface and the inactive surface of the semiconductor chips 120A and 120B.

Thicknesses of the wiring layers 112a, 112b, and 112c of the first connection member 110 may be greater than those of the redistribution layers 142a, 142b, and 142c of the second connection member 140. Since the first connection member 110 may have a thickness equal to or greater than that of the semiconductor chips 120A and 120B, the wiring layers 112a, 112b, and 112c may be formed at larger sizes depending on a scale of the first connection member 110. On the other hand, the redistribution layers 142a, 142b, and 142c of the second connection member 140 may be formed at sizes relatively smaller than those of the wiring layers 112a, 112b, and 112c for thinness.

A material of each of the insulating layers 111a and 111b is not particularly limited. For example, an insulating material may be used as the material of the insulating layers 111a and 111b. In this case, the insulating material may be a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternatively, a PID resin may also be used as the insulating material.

The wiring layers 112a, 112b, and 112c may serve to redistribute the connection pads 122 and 125 of the semiconductor chips 120A and 120B. A material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of their corresponding layers. For example, the redistribution layer 142 may include ground patterns, signal patterns, and the like. Here, the signal patterns may include various signals except for the ground patterns, the power patterns, and the like, such as data signals, and the like. In addition, the wiring layers 112a, 112b, and 112c may include via pads, wire pads, connection terminal pads, and the like.

The vias 113a and 113b may electrically connect the wiring layers 112a, 112b, and 112c formed on different layers to each other, resulting in an electrical path in the first connection member 110. A material of each of the vias 113a and 113b may be a conductive material. Each of the vias 113a and 113b may be completely filled with a conductive material, or a conductive material may also be formed along a wall of each of via holes. In addition, each of the vias 113a and 113b may have all of the shapes known in the related art, such as a tapered shape, a cylindrical shape, and the like. When holes for the first vias 113a are formed, some of the pads of the first wiring layer 112a may serve as a stopper, and it may thus be advantageous in a process that each of the first vias 113a has the tapered shape of which a width of an upper surface is greater than that of a lower surface. In this case, the first vias 113a may be integrated with pad patterns of the second wiring layer 112b. In addition, when holes for the second vias 113b are formed, some of the pads of the second wiring layer 112b may serve as a stopper, and it may thus be advantageous in a process that each of the second vias 113b has the tapered shape of which a width of an upper surface is greater than that of a lower surface. In this case, the second vias 113b may be integrated with pad patterns of the third wiring layer 112c.

As illustrated in FIG. 12, a plurality of conductive vias 113a may be disposed along an outer portion of the first connection member 110. In addition, the insulating via 131 may be disposed between the plurality of conductive vias, thereby more effectively adjusting thermal expansion characteristics.

Figure 13:
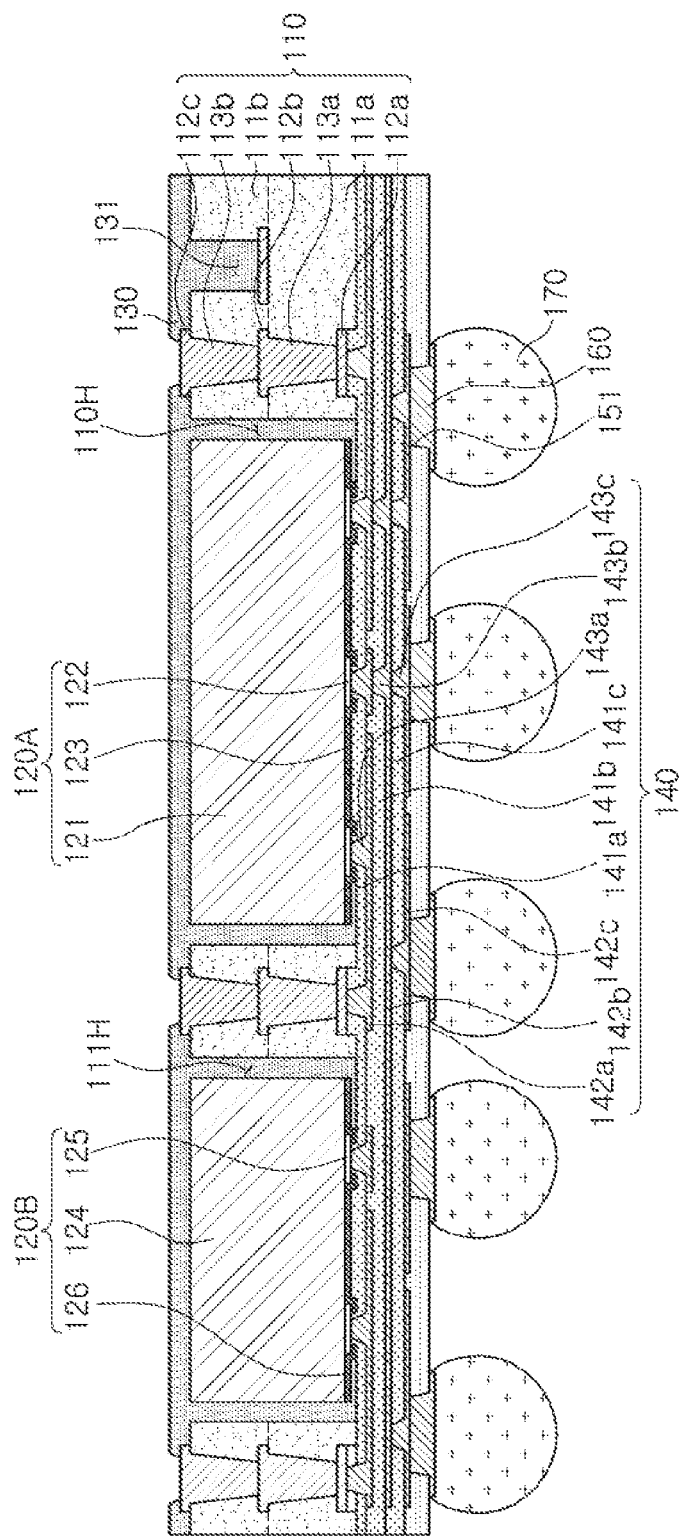

A modified example illustrated in FIG. 13 is similar to the examples of FIGS. 11 and 12, but a shape of the insulating via 131 is different from that in the examples of FIGS. 11 and 12. According to the present exemplary embodiment, the insulating via 131 may be formed so as not to penetrate through the first connection member 110. In other words, the insulating via 131 may have a trench shape which does not penetrate through the first connection member 110, and may be in contact with portions of the wiring layers 112a, 112b, and 112c. The above-mentioned modified example may be effectively applied to a case in which a large amount of insulating vias 131 are not required, a case in which a large amount of vias 113 and 113b or wiring layers 112a, 112b, and 112c are required in the first connection member 110 and an amount of insulating vias 131 needs to be reduced, and the like.

Figure 14:
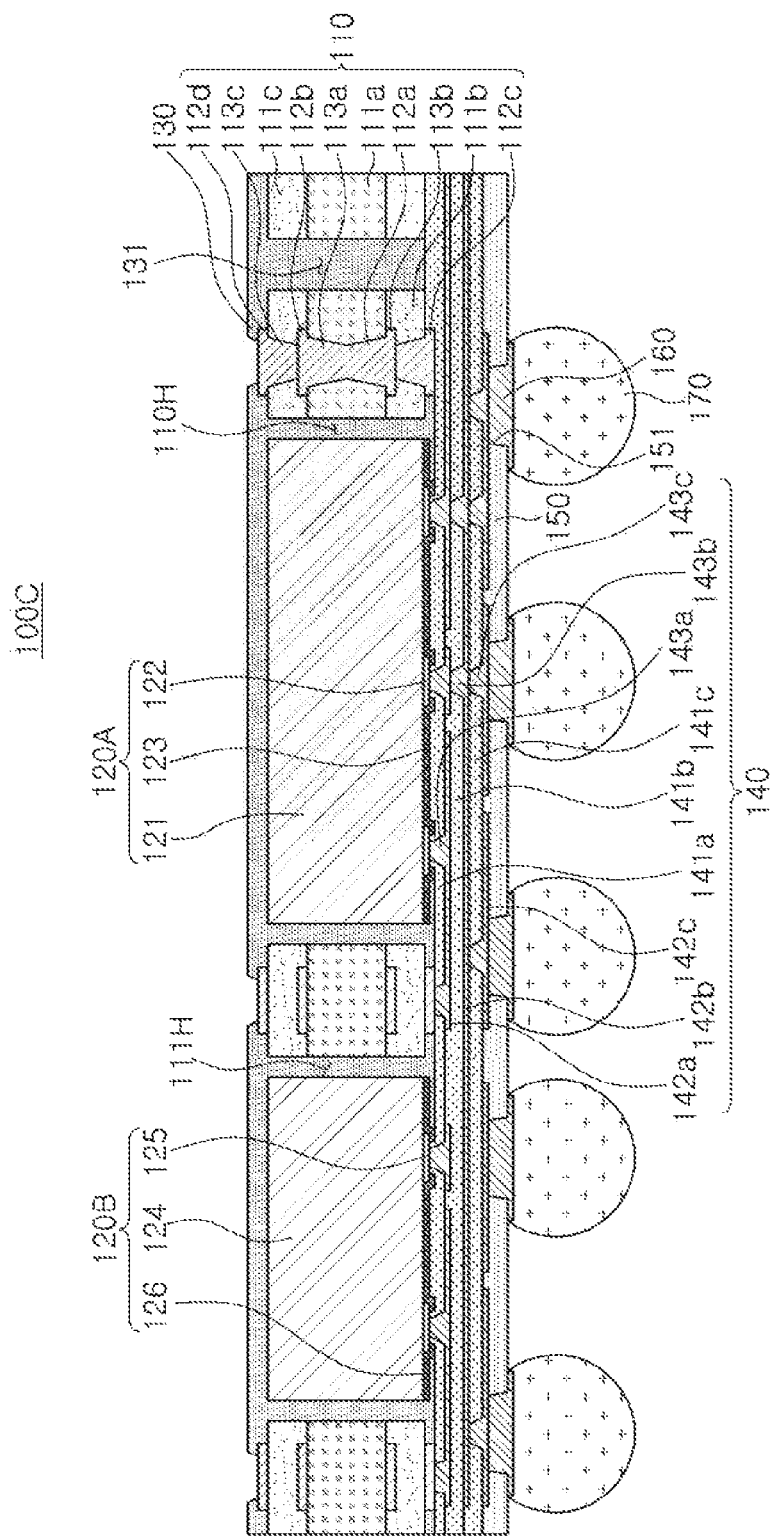

A fan-out semiconductor package 100C according to another modified example illustrated in FIG. 14 will be described. In the fan-out semiconductor package 100C according to another modified example, a first connection member 110 may include a first insulating layer 111a, a first wiring layer 112a and a second wiring layer 112b disposed on opposite surfaces of the first insulating layer 111a, respectively, a second insulating layer 111b disposed on the first insulating layer 111a and covering the first wiring layer 112a, a third wiring layer 112c disposed on the second insulating layer 111b, a third insulating layer 111c disposed on the first insulating layer 111a and covering the second wiring layer 112b, and a fourth wiring layer 112d disposed on the third insulating layer 111c. The first to fourth wiring layers 112a, 112b, 112c, and 112d may be electrically connected to connection pads 122. Since the first connection member 110 may include a larger number of wiring layers 112a, 112b, 112c, and 112d, a second connection member 140 may be further simplified. Therefore, a decrease in a yield depending on a defect occurring in a process of forming the second connection member 140 may be suppressed. Meanwhile, the first to fourth wiring layers 112a, 112b, 112c, and 112d may be electrically connected to each other through first to third vias 113a, 113b, and 113c each penetrating through the first to third insulating layers 111a, 111b, and 111c.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF or a PID film including a filler and an insulating resin. However, the materials of the first insulating layer 111a and the second and third insulating layers 111b and 111c are not limited thereto. Similarly, the first vias 113a penetrating through the first insulating layer 111a may have a diameter greater than those of second vias 113b and third vias 113c each penetrating through the second insulating layer 111b and the third insulating layer 111c.

A lower surface of the third redistribution layer 112c of the first connection member 110 may be disposed on a level below lower surfaces of the connection pads 122 and 125 of the semiconductor chips 120A and 120B. In addition, a distance between a first redistribution layer 142a of the second connection member 140 and the third wiring layer 112c of the first connection member 110 may be smaller than that between the first redistribution layer 142a of the second connection member 140 and the connection pads 122 and 125 of the semiconductor chips 120A and 120B. The reason is that the third wiring layer 112c may be disposed in a protruding form on the second insulating layer 111b, resulting in being in contact with the second connection member 140. The first wiring layer 112a and the second wiring layer 112b of the first connection member 110 may be disposed on a level between an active surface and an inactive surface of the semiconductor chips 120A and 120B. The first connection member 110 may be formed at a thickness corresponding to that of the semiconductor chips 120A and 120B. Therefore, the first wiring layer 112a and the second wiring layer 112b formed in the first connection member 110 may be disposed on the level between the active surface and the inactive surface of the semiconductor chips 120A and 120B.

Thicknesses of the wiring layers 112a, 112b, 112c, and 112d of the first connection member 110 may be greater than those of the redistribution layers 142a, 142b, and 142c of the second connection member 140. Since the first connection member 110 may have a thickness equal to or greater than those of the semiconductor chips 120A and 120B, the wiring layers 112a, 112b, 112c, and 112d may also be formed at larger sizes. On the other hand, the redistribution layers 142a, 142b, and 142c of the second connection member 140 may be formed at relatively smaller sizes for thinness.

Other configurations, for example the contents described with reference to FIGS. 9 through 13 may also be applied to the fan-out semiconductor package 100C according to another exemplary embodiment, and a detailed description thereof is substantially the same as that described in the fan-out semiconductor package 100A described above. Therefore, the detailed description thereof will be omitted.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to the exemplary embodiment in the present disclosure, a fan-out semiconductor package in which structural stability may be improved by reducing the warpage may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
   a first connection member having a through-hole;
   a first semiconductor chip and a second semiconductor chip, the first semiconductor chip and the second semiconductor chip being disposed in the through-hole;
   an encapsulant encapsulating the first semiconductor chip and the second semiconductor chip;
   a second connection member disposed on at least one side of the first semiconductor chip and the second semiconductor chip and including a redistribution layer electrically connected to the first semiconductor chip and the second semiconductor chip; and
   an insulating via extending through at least a portion of the first connection member in a thickness direction and being filled with an insulating material,
   wherein the insulating via has a width smaller than that of the through-hole and is spaced apart from the through-hole.

2. The fan-out semiconductor package of claim 1, wherein the insulating material forming the insulating via has the same coefficient of thermal expansion as that of the encapsulant.

3. The fan-out semiconductor package of claim 1, wherein the insulating material filling the insulating via is a material forming the encapsulant.

4. The fan-out semiconductor package of claim 1, wherein the insulating via comprises a plurality of insulating vias having a cylindrical shape and being aligned and disposed in one direction.

5. The fan-out semiconductor package of claim 1, wherein the insulating via penetrates through the first connection member.

6. The fan-out semiconductor package of claim 1, wherein the insulating material in the insulating via is in direct contact with an insulating layer of the first connection member.

7. The fan-out semiconductor package of claim 1, wherein the first semiconductor chip has a size greater than that of the second semiconductor chip.

8. The fan-out semiconductor package of claim 7, wherein the fan-out semiconductor package is a left and right asymmetric structure with respect to a center line perpendicular to a first direction in which the first semiconductor chip and the second semiconductor chip are arranged.

9. The fan-out semiconductor package of claim 8, wherein in the first connection member, a width of an outer region of the first semiconductor chip is greater than a width of an outer region of the second semiconductor chip with respect to the first direction.

10. The fan-out semiconductor package of claim 9, wherein an amount of encapsulant in a half region in which the second semiconductor chip is disposed is greater than an amount of encapsulant in a half region in which the first semiconductor chip is disposed with respect to the center line perpendicular to the first direction.

11. The fan-out semiconductor package of claim 9, wherein the insulating via is only disposed in the outer region of the first semiconductor chip.

12. The fan-out semiconductor package of claim 11, wherein the first connection member includes a plurality of conductive vias penetrating through the first connection member, and
   the plurality of conductive vias are arranged along an outer portion of the first connection member.

13. The fan-out semiconductor package of claim 12, wherein the insulating via is disposed between the plurality of conductive vias.

14. The fan-out semiconductor package of claim 1, wherein the insulating via has a trench shape which does not penetrate through the first connection member.

15. The fan-out semiconductor package of claim 14, wherein the insulating via is in contact with a wiring layer included in the first connection member.

16. A fan-out semiconductor package comprising:
   a first connection member having a first through-hole and a second through-hole;
   a first semiconductor chip and a second semiconductor chip disposed in the first through-hole and the second through-hole, respectively, the first semiconductor chip having a size different from that of the second semiconductor chip;
   an encapsulant disposed in the first through-hole and the second through-hole and encapsulating the first semiconductor chip and the second semiconductor chip such that an amount of the encapsulant in the first through-hole is less than an amount of the encapsulant in the second through-hole;
   a second connection member disposed on at least one side of the first semiconductor chip and the second semiconductor chip and including a redistribution layer electrically connected to the first semiconductor chip and the second semiconductor chip; and an insulating via extending through at least a portion of the first connection member and being filled with an insulating material, wherein the insulating via is disposed adjacent the first through-hole and away from the second through-hole, and the insulating via has a width smaller than that of the first through-hole and that of the second through-hole.

17. The fan-out semiconductor package of claim 16, wherein the insulating material has substantially the same thermal expansion coefficient as that of the encapsulant.

18. The fan-out semiconductor package of claim 16, wherein the insulating via penetrates through the first connection member.

19. The fan-out semiconductor package of claim 16, wherein the insulating via comprises a plurality of insulating vias.

20. The fan-out semiconductor package of claim 16, wherein the insulating material in the insulating via is in direct contact with an insulating layer of the first connection member.

\* \* \* \* \*